United States Patent [19]

Toshima et al.

[11] Patent Number: 4,899,686

[45] Date of Patent: Feb. 13, 1990

[54] COATING DEVICE

[75] Inventors: Takayuki Toshima, Nirasaki; Osamu Hirakawa, Kumamoto, both of Japan

[73] Assignees: Tokyo Electron Limited, Tokyo; Tel Kyushu Limited, Kumamoto, both of Japan

[21] Appl. No.: 332,969

[22] Filed: Apr. 4, 1989

[30] Foreign Application Priority Data

Apr. 8, 1988 [JP] Japan .................................. 63-86735

[51] Int. Cl.⁴ .............................................. B05C 1/02
[52] U.S. Cl. ...................................... 118/50; 118/52; 118/54
[58] Field of Search ............................... 118/50, 52, 54

[56] References Cited

U.S. PATENT DOCUMENTS

| | | | |
|---|---|---|---|
| 3,791,342 | 2/1974 | Boyer et al. | 118/52 |
| 4,510,176 | 4/1985 | Cuthbert et al. | 118/52 |
| 4,790,262 | 12/1988 | Nakayama et al. | 118/52 |
| 4,838,979 | 6/1989 | Nishida et al. | 118/52 |

Primary Examiner—Willard Hoag
Attorney, Agent, or Firm—Oblon, Spivak, McClelland, Maier & Neustadt

[57] ABSTRACT

A coating device includes a ring-shaped outer circumferential groove formed along and adjacent to the outer circumferential rim of a cup means and communicated with a processing vessel, and a processing liquid supply source connected to the outer circumferential groove through nozzles. A partition wall is erected, as an inner wall of the cup means, inside the outer circumferential groove with the nozzles and a groove interposed between them. The supply of the processing liquid can be thus made stable and processing failure because of air bubbles mixed in the liquid and irregular coating of the liquid on substrates can be prevented.

10 Claims, 7 Drawing Sheets

COATING DEVICE

BACKGROUND OF THE INVENTION

1. Field of the Invention

The present invention relates to a dip processor device suitable for coating of processing liquids such as the resist liquid and developer.

2. Description of the Related Art

Devices for processing substrates one by one with processing liquid have been often used to enable the processes to be automatically and continuously carried out with no hand of the human being needed in the processes of coating photoresist film and developing the photoresist film thus formed in the course of manufacturing semiconductor devices.

These processor devices which have been well known are of the spin and dip types. When used as the developer device, for example, this processor device of the spin type has such an arrangement that the developer is supplied onto the substrate through nozzles and sprays located above the substrate to be processed. The amount of the developer which can be swelled on the substrate has a limit because of its surface tension. Further, the coating of the developer onto the substrate becomes sometimes irregular, depending upon the amount of the developer supplied. Furthermore, non-uniform development is likely to be caused by the impact of the developer against the substrate when it drops onto the substrate.

In the case of the processor device of the dip type, however, the impact of the developer against the substrate is lower. In addition, the swelling of the developer on the substrate can be attained quickly. Further, the height of the developer swelled on the substrate can be made larger. Particularly the dip processor device has become essential these days in the case where a developer whose surface tension is made low because of surface-active agent used is employed to enhance the resolution.

There have been well known the dip processor device wherein a cup means sealingly contacted with the underside of a substrate to be processed and having an inner space enough to enable the substrate to be fully dipprocessed is provided and when the cup means is contacted with the underside of the substrate, they cooperate to form a processing vessel.

When used as the developer device, this dip processor device includes a developer supply system located beside the substrate in the cup means to gradually supply the developer to the substrate to be processed. As shown in FIG. 1, the developer supply system includes ring-shaped outer circumferential groove 3 located beside substrate 1 in cup means 2. Developer supply tube 4 is connected to this outer circumferential groove 3 and slit-like nozzle 5 extends from outer circumferential groove 3 toward substrate 1. When arranged like this, developer 32 supplied to outer circumferential groove 3 can be supplied to substrate 1 in the processing vessel in all directions.

In the case of this developer device, however, developer 32 in outer circumferential groove 3 flows to the processing vessel after the supply of developer 32 is stopped. This allows air space 7 to be formed in outer circumferential groove 3. This air space 7 has almost no influence when the developer supply system is under operation to continuously feed developer 32 to the processing vessel, but when it is left inoperative for a long time, air space 7 becomes large, which causes the amount of the developer fed to become unstable. In addition, when the developer is fed, air is also fed together with the developer. In other words, the developer containing air bubbles therein is fed causing the development to be blurred.

Further, the nozzle is shaped like a slit in this developer device to reduce the loss of pressure when the developer is fed. When the nozzle is shaped like this, however, the developer fed into the processing vessel through this nozzle is likely to become non-, uniform.

Same thing can be said when the dip processor device is used as the resist film coating device, for example.

SUMMARY OF THE INVENTION

The object of the present invention is to provide a coating device capable of making the supply of a processing liquid such as the developer and photoresist liquid stable to prevent processing failure such as blurred coating of the processing liquid on substrates from being caused because of air bubbles mixed in the processing liquid.

According to the present invention, this object can be achieved by a coating device comprising a cup means having an opening through which substrates to be processed are mounted in and out of the cup means and serving to form a processing vessel with its bottom sealingly contacted with the underside of the substrate to be processed; a ring-shaped outer circumferential groove formed in the circumferential wall of said cup means and communicated with the processing vessel; a plurality of nozzles connected to a processing liquid supply source at their one ends while to the outer circumferential groove, said nozzles being arranged along the inner circumferential rim of the outer circumferential groove at a certain interval; and a partition wall erected to form an inner wall of the cup means, facing said nozzles with a certain interval interposed between them.

DETAILED DESCRIPTION OF THE PREFERRED EMBODIMENTS

Some embodiments of the present invention will be described with reference to the accompanying drawings.

Figure 1:
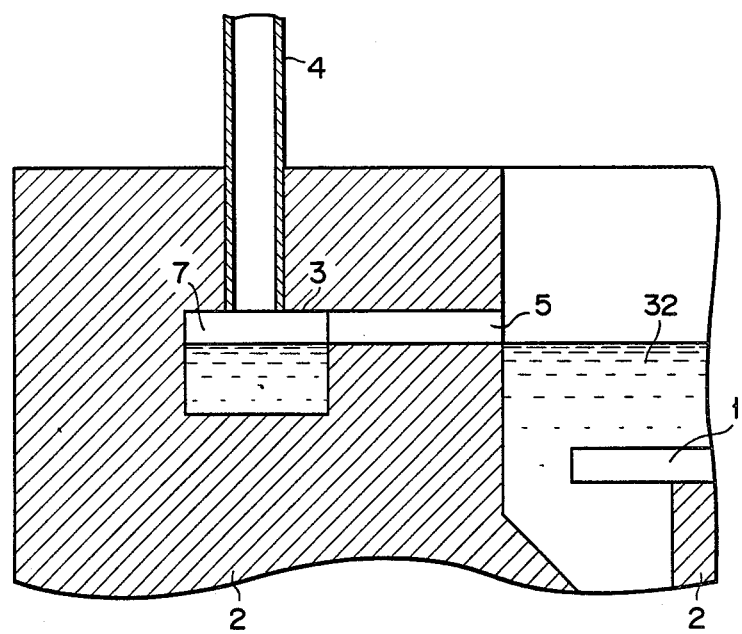
FIG. 1 shows the conventional coating device to explain its drawbacks.
Figure 2:
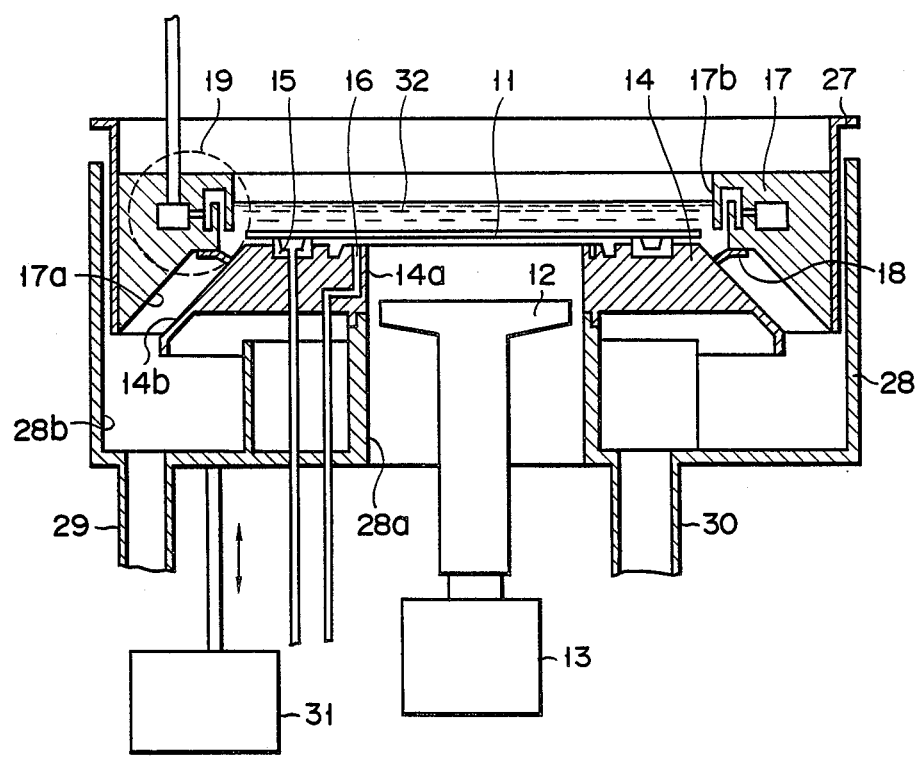
FIG. 2 is a sectional view showing an example of the coating device according to the present invention.

FIG. 2 is a sectional view showing an example of the coating device according to the present invention. Reference numeral 11 represents a substrate to be processed, which is a semiconductor wafer, for example.

Substrate 11 to be processed is held on mount 12, which is connected to rotary system 13 and rotated along with substrate 11 at high speed. Mount 12 is located in through-hole 14a in the center of lower cup 14 to freely move up and down therein.

Ring-shaped suction pad 15 which serves to suck and hold substrate 11 at the time of dip developing process is provided on the top of lower cup 14. Suction pad 15 is connected to a vacuum system (not shown) such as the vacuum pump. Sealing is established between substrate 11 and lower cup 14 by this suction pad 15. Washing nozzle 16 is also opened at the top of lower cup 14 to wash the underside of substrate 11 after the developing process. Lower cup 14 is shaped like a cone, having a slope 14a tilted downward from its top. Cylindrical upper cup 17 having an inner face formed as slope 17a titled downward and parallel to slope 14a of lower cup 14 and also having opening 17b which serves as the side wall of a processing vessel is located above lower cup 14. Sealing is established between between upper and lower cups 14 and 17 by means of seal ring 18 attached to the inner face of upper cup 17. Substrate 11, lower cup 14, seal ring 18 and upper cup 17 cooperate to form the sealed processing vessel.

Figure 3:
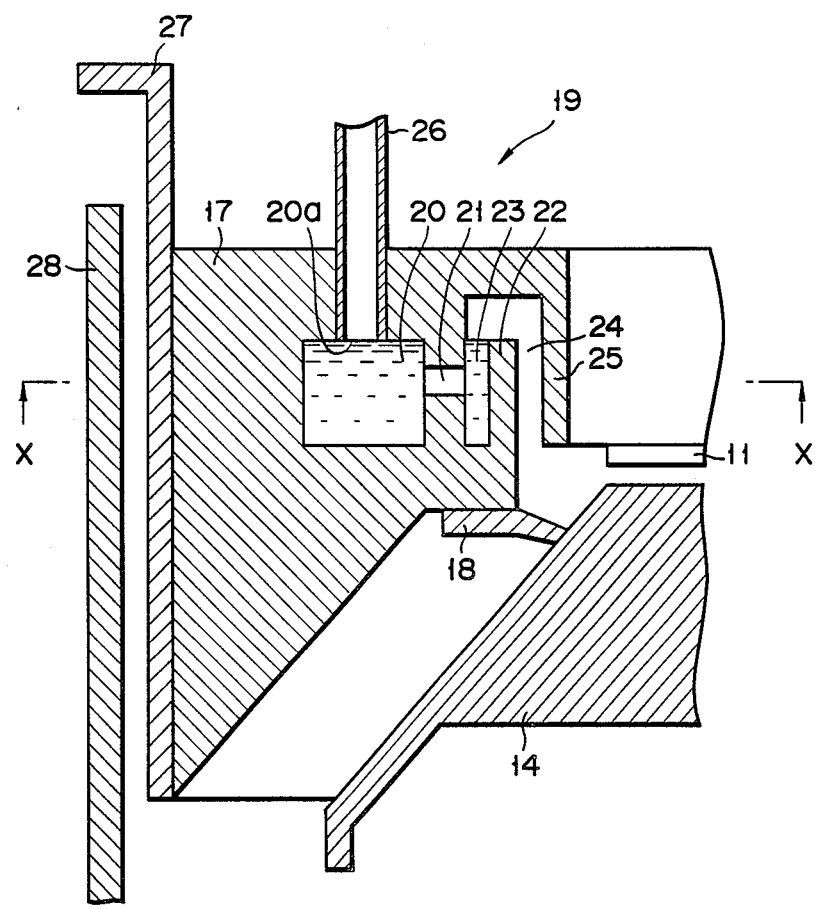
FIG. 3 is an enlarged sectional view showing a developer supply system of the coating device in FIG. 2.
Figure 4:
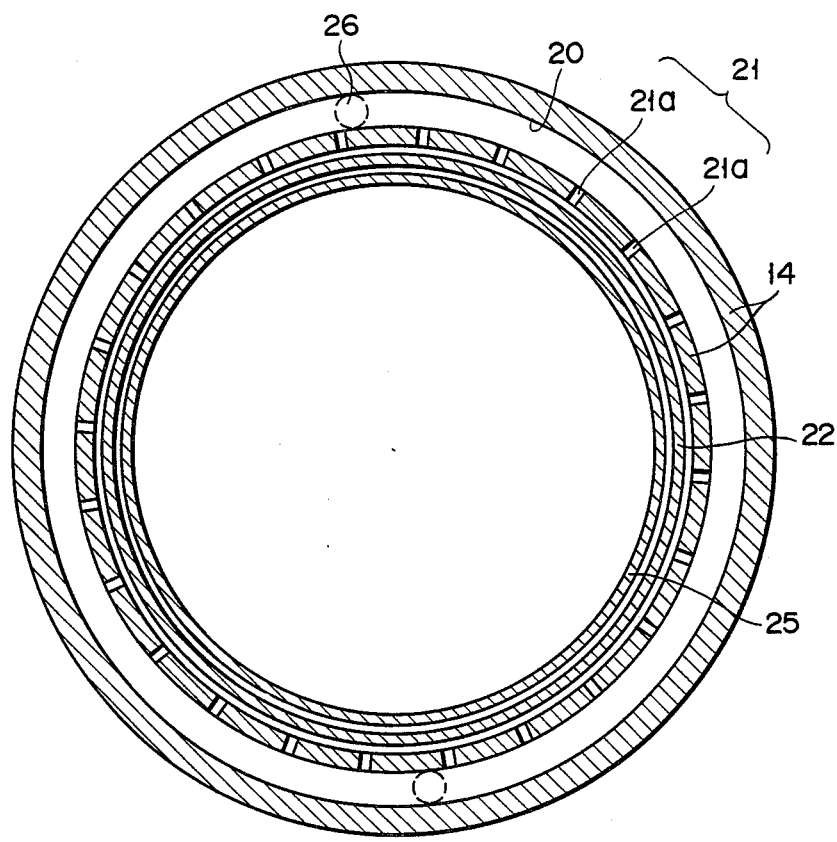
FIG. 4 is a sectional view taken along a line X—X in FIG. 3.

System 19 for supplying a developer is provided in upper cup 17. As shown in FIGS. 3 and 4, this developer supply system 19 includes ring-shaped groove 20, nozzles group 21 consisting of a plurality of small-diameter nozzles 21a directed inward from the inner wall of groove 20, cylindrical partition wall 22 separated from the nozzles group 21 by a certain interval to form liquid-staying groove 23 inside nozzles group 21, plate 25 for cooperating with partition wall 22 to define passage 24 directed downward and communicated with nozzles 21a and liquid-staying groove 23, and developer supply tubes 26 communicated with groove 20. Groove 20 may be used as divided-groove or continuous-groove. The top of partition wall 22 is at least same in level as upper surface 20a of groove 20 or preferably a little higher. The number of developer supply tubes 26 depends upon the amount of developer used.

When the developer is applied to the substrate of 6 inches at a desired rate the diameter of each of nozzles 21a is set 2 mm and the number of nozzles 21a is set about thirty six. When the diameter is set small and the number large like this, the loss of pressure can be kept low or about 2 kg/cm². In addition, the developer supplied through nozzles 21a can be kept uniform and any desired amount of developer can be supplied through nozzles 21a.

Inner cup 27 is located outside upper cup 17 to prevent the developer or liquid from being scattered while substrate 11 is being rinsed, cleaned or dried.

Cylindrical outer cup 28 is fixed to the underside of lower cup 14 to define the bottom and side wall of a developer device. Outer cup 28 has through-hole 28a into which mount 12 is loosely fitted. A groove 28b for discharging the developer or the like is formed on the bottom of outer cup 28 along the outer side wall thereof. Discharge tube 29 is connected to discharge groove 28b. Connected to discharge groove 28b is discharge tube 30 to prevent the developer or liquid from being scattered as mists onto substrate 11 while substrate 11 is being rinsed, cleaned or dried. Discharge tube 30 is connected to a discharge system (not shown).

Lifter system 31 such as the air cylinder for driving outer and lower cups 28 and 14 up and down is located under outer cup 28. Substrate 11 is brought under developing condition and also under rinsing, cleaning or drying condition by lifter system 31.

Figure 5:
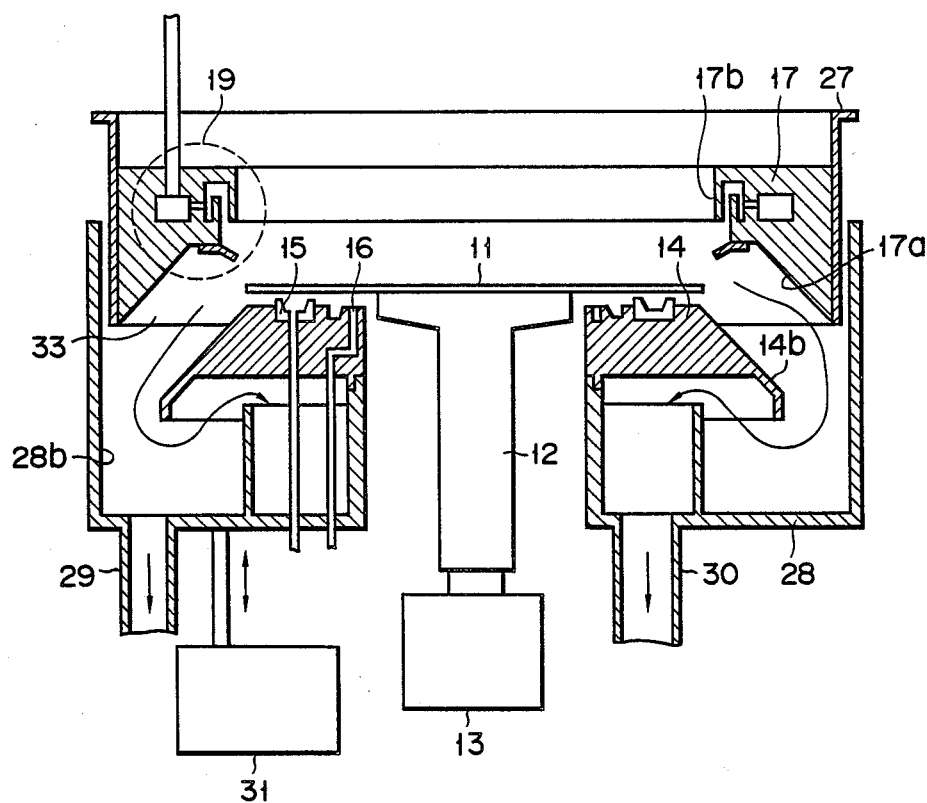
FIG. 5 shows how the coating device in FIG. 2 functions.

As shown in FIG. 5, substrate 11 to be processed is mounted and then sucked onto mount 12 which is ready for rinsing, cleaning or drying process. The carrying-in and -out of substrate 11 to and from mount 12 is conducted by moving mount 12 up and down by means of a lifter system. More specifically, mount 12 which is ready for rinsing, cleaning or drying process is moved up and down by the lifter system to position its top higher than that of inner cup 27, and substrate 11 is then mounted on and removed from mount 12 which is under this state by means of a carrier system located outside.

Outer and lower cups 28 and 14 are lifted by lifter system 31 and substrate 11 is moved from mount 12 onto suction pad 15. When substrate 11 is mounted on suction pad 13, the vacuum system is made operative. Sealing is thus established between substrate 11 and lower cup 14. Lower cup 14 is lifted by lifter system 31 to strike seal ring 18 of upper cup 17 against slop 14b of lower cup 14. Seal ring 18 is kept sealingly contacted with lower cup 14 by lifter system 31 to form the processing vessel. This state is shown in FIG. 2.

The developer is supplied to groove 20 through developer supply tubes 26. Developer 32 supplied to groove 20 is further supplied to liquid-staying groove 23 through nozzles group 21. Developer 32 comes over the top of partition wall 22. passes through passage 24 directed downward by innermost wall 25 and gradually reaches substrate 11 from below in the processing vessel. Developer 32 is supplied to the processing vessel through a plurality of small-diameter nozzles 21a. This allows developer 32 to be uniformly swelled on substrate 11 in all direction thereof. Further, even when the supply of developer 32 is stopped, developer 32 in liquid-staying groove 23 is not allowed to flow to the processing vessel. Developer 32 in liquid-staying groove 23 can be thus kept same in level as the top of partition wall 22. Groove 20 is also filled with developer 32 to its top 20a due to the cooperation of liquid-staying groove 23 and partition wall 22, thereby preventing air bubbles from being formed in developer 32.

The processing vessel is filled with a predetermined amount of developer 32 and the dip developing process is carried out for a predetermined time period. Lower cup 14 is then lowered by lifter system 31. Lower cup 14 is thus separated from upper cup 17. As the result, developer 32 drops by its own weight into discharge groove 28b, passing through passage 33 between upper and lower cups 17 and 14. It is then discharged outside through discharge pipe 29. Since the cross sectional area of the discharge passage can be made sufficiently large, the discharge of developer 32 can be made quick.

lower cup 14 is further lowered by lifter system 31 and substrate 11 is moved onto mount 12 (see FIG. 5). Rotary system 13 is made operative to rotate substrate 11 at high speed. Developer 32 remaining on substrate 11 is thus removed. Rinsing liquid is supplied through a rinsing nozzle (not shown) at the same time and the developing process is stopped while substrate 11 is rinsed.

Cleaning liquid is jetted through nozzle 16 to clean the underside of substrate 11 at the same time.

Air in the developer device is exhausted through exhaust pipe 30 while the cleaning process is being carried out relative to the underside of substrate 11 to create flows of exhausted air as shown by arrows in FIG. 5. These flows of exhausted air prevent the rinsing liquid or the like from being scattered as mists to adhere onto substrate 11.

When the rinsing and cleaning steps are finished, substrate 11 is rotated for a certain time period and dried. A cycle of the dip developing process is thus finished.

According to the dip developer device of the present invention, the developer supply system comprises the outer circumferential groove, nozzles group and partition wall whose top is at least same in level as the top of the outer circumferential groove. Even after the supply of the developer is stopped, therefore, the developer having an upper face at least same in level as the top of the outer circumferential groove remains in the liquid-staying groove outside the partition wall. As the result, the outer circumferential groove is similarly filled with the developer to its top, causing no developer to flow. Even after the developer device is left inoperative for a long time, therefore, no air room is formed in the outer circumferential groove so that a certain amount of the developer can be supplied at all times. In addition, no air bubble is created in the developer and this prevents unsteady supply of the developer, patches of development and underdevelopment. Further, the developer is supplied into the processing vessel through a plurality of small-diameter nozzles. The loss of pressure becomes a little large but it can be reduced as a whole to such an extent as gives no influence to the amount of the developer supplied through these nozzles. The developer can be uniformly supplied to the substrate in all directions due to the numerous small-diameter nozzles. This prevents the development from becoming irregular.

Figure 6:
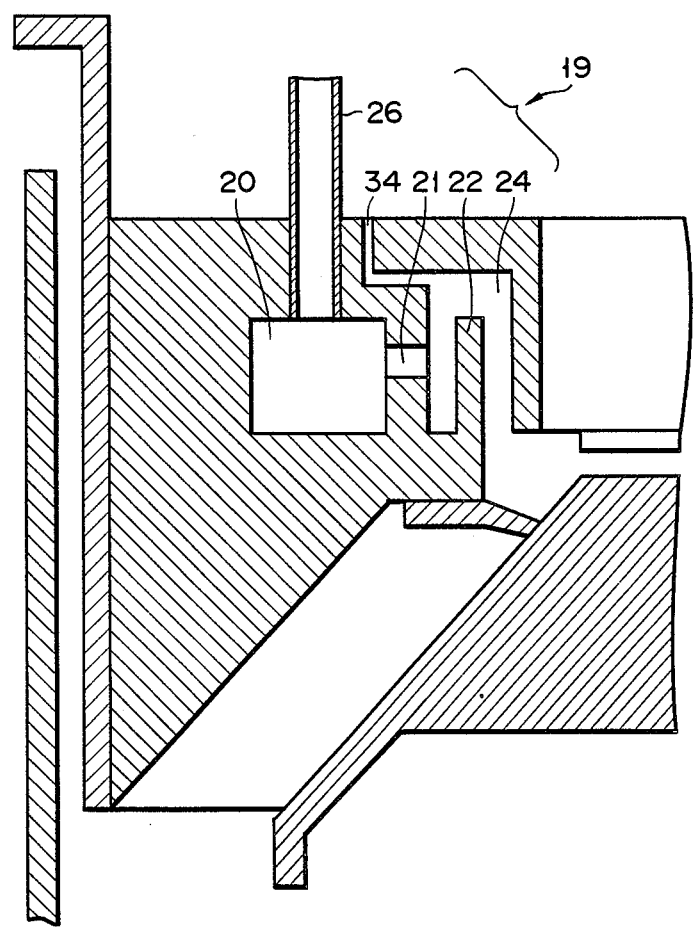
FIG. 6 is a sectional view showing another example of the coating device according to the present invention.

As shown in FIG. 6, air escaping passage 34 may be arranged above passage 24 extending from nozzles group 21 through liquid-staying groove 23 in the developer supply system. The supply of the developer can be made more stable due to this air escaping passage 34.

The developer usually has surface tension. This sometimes causes the developer to be left due to its surface tension in the narrow passage 24 between partition and inner walls 22 and 25. When the developer is passed through passage 24 under this state, air in passage 24 is mixed with the developer. This is the reason why air escaping passage 34 is located along the top of passage 24, as shown in FIG. 6. This allows only the developer to be supplied through passage 24 and air left to be exhausted through air escaping passage 34.

It is preferable that air escaping passage 34 is made same in level as the top of passage 34 and directed outward. It is also preferable that air escaping passage 34 has a groove width of about 0.01–0.5 mm. When air escaping passage 34 is designed like this, it allows only air but not liquid to pass through it even if the developer flows upward in liquid-staying groove 23 and reaches it.

The coating device according to the present invention is useful in coating the whole of a substrate with liquid processing agent or in the coating process of photoresist liquid employed in the course of manufacturing semiconductor wafers, for example, because the supply of the resist liquid can be made stable.

Figure 7:
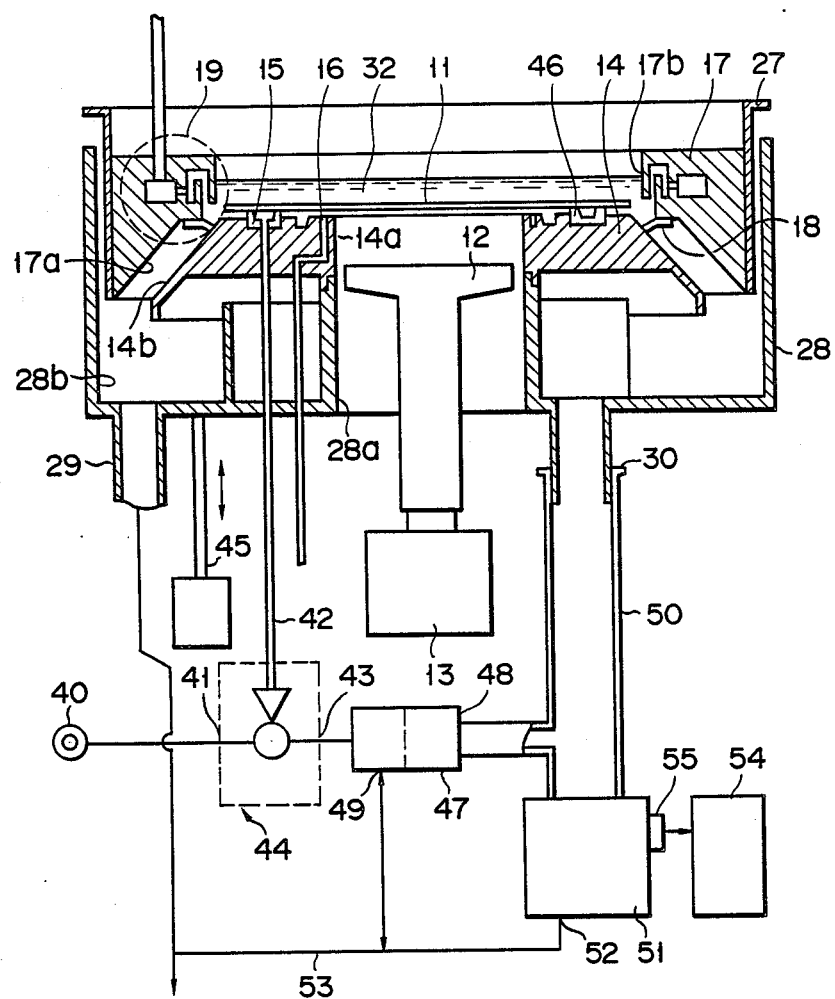
FIG. 7 is a sectional view showing a further example of the coating device according to the present invention.

As shown in FIG. 7, it is preferable that airliquid separator means (B) or the like is connected to exhaust pipe 30. Reference numeral 40 represents a compression air source which is a part of a vacuum generator means. The vacuum generator means supplies compressed air to generate vacuum. Vacuum means 44 of the air pressure type includes air inlet 41 through which compressed air is supplied from compression air source 40, pipe 42 made vacuous because vacuum means 44 serves as a venturi when compressed air is supplied into vacuum means 44, and air outlet 43. Pipe 42 is connected to suction pad 15 of lower cup 14. Suction pad 15, suction groove 46 and vacuum means 44 cooperate to form a vacuum suction means. Air-liquid separator means 47 is connected to air outlet 43 of vacuum means 44 which is a part of the vacuum suction means. Air separated from liquid is discharged through air exhaust 48 while liquid separated from air through liquid discharge 49.

Exhaust pipe 30 of outer cup 28 is connected to air-liquid separator means 51 through pipe 50. This air-liquid separator means 51 has a large volume. More specifically, air-liquid separator means 51 is arranged to collect fine particles of mist and liquidize them due to decompression effect of air exhausted and baffles located in separator means 51. Liquid separated by air-liquid separator means 51 is discharged through liquid discharge opening 52 while air separated through exhaust opening 53. Exhaust opening 53 is connected to means 54 for processing exhausted air of alkali.

Exhaust opening 48 of air-liquid separator means 47 is connected to pipe 50 and air exhausted is processed by air-liquid separator means 51.

Liquid discharged through pipe 29 of outer cup 28, opening 49 of air-liquid separator means 47, and opening 52 of air-liquid separator means 51 is collected through pipe 55 and processed by discharged liquid processor means (not shown).

The vacuum suction means on the top of lower cup 14 to suck the underside of substrate 11 along and adjacent to the circumferential rim thereof may be formed as follows. The top of vacuum suction groove 46 is made flat. The outer diameter of that portion of groove 46 which is contacted with the underside of substrate 11 is made equal to or a little smaller than the diameter of substrate 11. Suction pad 15 made of hydrohobic material such as ethylene trifluoride resin which has water repelling characteristic is arranged on suction groove 46. The ethylene trifluoride resin is excellent in water repelling and chemical resistant capacity and it has a higher hardness as compared with ethylene tetrafluoride resin, for example. It is less broken upon its sucking the semiconductor wafers and air is therefore less leaked through the pad.

The ethylene trifluoride resin has a low heat conductivity and it can attain high heat insulation effect even in the developing process in which temperature change is not desirable.

Suction pad 15 is made of hydrohobic material and the outer diameter of that portion of pad 15 which is contacted with the underside of substrate 11 is made smaller than the diameter of pad 15, as described above. When substrate 11 is only rotated, therefore, liquid remaining on substrate 11 can be completely shaken down.

What is claimed is:

1. A coating device comprising:
    a cup means having an opening through which substrates to be processed are mounted in and out of the cup means and serving to form a processing vessel with its bottom sealingly contacted with the underside of the substrate to be processed;
    a ring-shaped outer circumferential groove formed in the circumferential wall of said cup means and communicated with the processing vessel;

a plurality of nozzles each connected to a processing liquid supply source at one end thereof and also connected to the outer circumferential groove, said nozzles being arranged along the inner circumferential rim of the outer circumferential groove at a certain interval; and a partition wall erected to form an inner wall of the cup means, facing said nozzles with a certain interval interposed between them.

2. The coating device according to claim 1, wherein an air-liquid separator means is connected to the cup means through an exhaust pipe which is communicated with the processing vessel.

3. The coating device according to claim 1, wherein the width of the outer circumferential groove ranges 0.01–0.5 mm.

4. The coating device according to claim 1, wherein an air escaping passage communicated with the outer circumferential groove is provided.

5. The coating device according to claim 1, wherein the bottom of said cup means which is sealingly contacted with the underside of the substrate to be processed is formed by a lower cup.

6. The coating device according to claim 5, wherein the lower cup is housed in an outer cup.

7. The coating device according to claim 5, wherein that face of the lower cup which is contacted with the substrate to be processed is made flat and the outer diameter of that portion of the lower cup which is contacted with the underside of the substrate is made smaller than the diameter of the substrate.

8. The coating device according to claim 7, wherein a mount for sucking and fixing the substrate to be processed is arranged freely movable up and down in the loewr cup and a ring-shaped vacuum suction groove is formed on that portion of the mount which is contacted with the underside of the substrate.

9. The coating device according to claim 7, wherein that portion of said lower cup which is contacted with the underside of the substrate to be processed is made of hydrohobic material.

10. The coating device according to claim 9, wherein said hydrophobic material is ethylene trifluoride.

* * * * *